(12) United States Patent
Rivero et al.

(10) Patent No.: US 10,593,772 B2
(45) Date of Patent: Mar. 17, 2020

(54) DOUBLE-GATE MOS TRANSISTOR WITH INCREASED BREAKDOWN VOLTAGE

(71) Applicant: STMicroelectronics (Rousset) SAS, Rousset (FR)

(72) Inventors: Christian Rivero, Rousset (FR); Julien Delalleau, Marseilles (FR)

(73) Assignee: STMicroelectronics (Rousset) SAS, Rousset (FR)

(*) Notice: Subject to any disclaimer, the term of this patent is extended or adjusted under 35 U.S.C. 154(b) by 0 days.

(21) Appl. No.: 16/036,240

(22) Filed: Jul. 16, 2018

(65) Prior Publication Data

US 2019/0027566 A1 Jan. 24, 2019

(30) Foreign Application Priority Data

Jul. 21, 2017 (FR) ...................................... 17 56935

(51) Int. Cl.
*H01L 29/423* (2006.01)
*H01L 27/11521* (2017.01)
(Continued)

(52) U.S. Cl.
CPC .. *H01L 29/42324* (2013.01); *H01L 27/11521* (2013.01); *H01L 27/11524* (2013.01);
(Continued)

(58) Field of Classification Search
CPC ......... H01L 29/42324; H01L 29/42376; H01L 27/11524; H01L 29/7881; H01L 29/66825;
(Continued)

(56) References Cited

U.S. PATENT DOCUMENTS 4,728,617 A 3/1988 Woo et al.
4,818,715 A 4/1989 Chao
(Continued)

FOREIGN PATENT DOCUMENTS

CN 103178096 A 6/2013
DE 19626089 A1 1/1998
(Continued)

OTHER PUBLICATIONS

Toshiyuki Oishi et al: "Isolation Edge Effect Depending on Gate Length of MOSFET's With Various Isolation Structures," IEEE Transactions on Electron Devices—IEEE Service Center, Piscataway, NJ, US, vol. 47, No. 4, Apr. 1, 2000 (Apr. 1, 2000)—ISSN: 0018-9383 * p. 1-p. 2; Figure 1*.
(Continued)

*Primary Examiner* — Syed I Gheyas
(74) *Attorney, Agent, or Firm* — Crowe & Dunlevy (57) ABSTRACT

A MOS transistor located in and on a semiconductor substrate has a drain region, a source region and a conductive gate region. The conductive gate region includes a first conductive gate region that is insulated from the semiconductor substrate and a second conductive gate region that is insulated from and located above the first conductive gate region. A length of the first conductive gate region, measured in the drain-source direction, is greater than a length of the second conductive gate region, also measured in the drain-source direction. The first conductive gate region protrudes longitudinally in the drain-source direction beyond the second conductive gate region at least on one side of the second conductive gate region so as to extend over at least one of the source and drain regions.

24 Claims, 6 Drawing Sheets

(51) Int. Cl.
*H01L 29/788* (2006.01)
*H01L 29/78* (2006.01)
*H01L 21/28* (2006.01)
*H01L 29/66* (2006.01)
*H01L 27/11524* (2017.01)

(52) U.S. Cl.
CPC .. *H01L 29/40114* (2019.08); *H01L 29/42376* (2013.01); *H01L 29/66825* (2013.01); *H01L 29/788* (2013.01); *H01L 29/7835* (2013.01); *H01L 29/7881* (2013.01)

(58) Field of Classification Search
CPC ........... H01L 21/28273; H01L 29/7835; H01L 29/788; H01L 27/11521
See application file for complete search history.

(56) References Cited

U.S. PATENT DOCUMENTS

| | | | |
|---|---|---|---|
| 5,976,932 A * | 11/1999 | Kerber | H01L 29/42324 |
| | | | 438/257 |
| 6,004,852 A | 12/1999 | Yeh et al. | |
| 6,346,467 B1 * | 2/2002 | Chang | H01L 21/28273 |
| | | | 257/E21.209 |
| 7,557,404 B2 * | 7/2009 | Koh | H01L 27/115 |
| | | | 257/315 |
| 8,067,807 B2 | 11/2011 | Taya | |
| 2002/0072173 A1 | 6/2002 | Aoki | |
| 2003/0006463 A1 | 1/2003 | Ichikawa | |
| 2005/0199939 A1 | 9/2005 | Lutze et al. | |
| 2006/0170055 A1 * | 8/2006 | Mitros | H01L 27/0629 |
| | | | 257/360 |
| 2009/0236654 A1 | 9/2009 | Ishihara et al. | |
| 2010/0032772 A1 | 2/2010 | Tanaka | |
| 2010/0158072 A1 * | 6/2010 | Fornara | H01H 1/0036 |
| | | | 374/152 |
| 2013/0092987 A1 | 4/2013 | Lopez | |
| 2014/0103440 A1 | 4/2014 | Chatterjee | |
| 2014/0370680 A1 * | 12/2014 | Chen | H01L 21/3083 |
| | | | 438/301 |

FOREIGN PATENT DOCUMENTS

| | | |
|---|---|---|
| DE | 19747776 A1 | 7/1998 |
| EP | 1501130 A1 | 1/2005 |
| FR | 2826496 A1 | 12/2002 |
| FR | 2831713 A1 | 5/2003 |
| JP | 2001326289 A | 11/2001 |
| WO | 2005083769 A1 | 9/2005 |

OTHER PUBLICATIONS

INPI Search Report and Written Opinion for FR 1756935 dated Mar. 15, 2018 (10 pages).

* cited by examiner

DOUBLE-GATE MOS TRANSISTOR WITH INCREASED BREAKDOWN VOLTAGE

PRIORITY CLAIM

This application claims the priority benefit of French Application for Patent No. 1756935 filed on Jul. 21, 2017, the content of which is hereby incorporated by reference in its entirety to the maximum extent allowable by law.

TECHNICAL FIELD

Embodiments of the invention relate to integrated circuits, and in particular to the field-effect transistors known in the art as double-gate metal-oxide semiconductor (MOS) field-effect transistors that are incorporated into these integrated circuits. Embodiments of the invention in particular aim to improve certain electrical characteristics of this type of transistor.

SUMMARY

Double-gate transistors are, for example, used in non-volatile memory cells.

For example, a non-volatile memory cell of an electrically-erasable programmable read-only memory (EEPROM) includes a double-gate state transistor (one gate being a floating gate and the other a control gate) that is selectable by way of a selection transistor that is connected in series with the state transistor.

With regard to simplifying the fabricating process of the memory cell, it is easier to produce a selection transistor comprising a double-gate transistor, the two gates of which are preferably connected together so as to form only a single gate.

Figure 1:
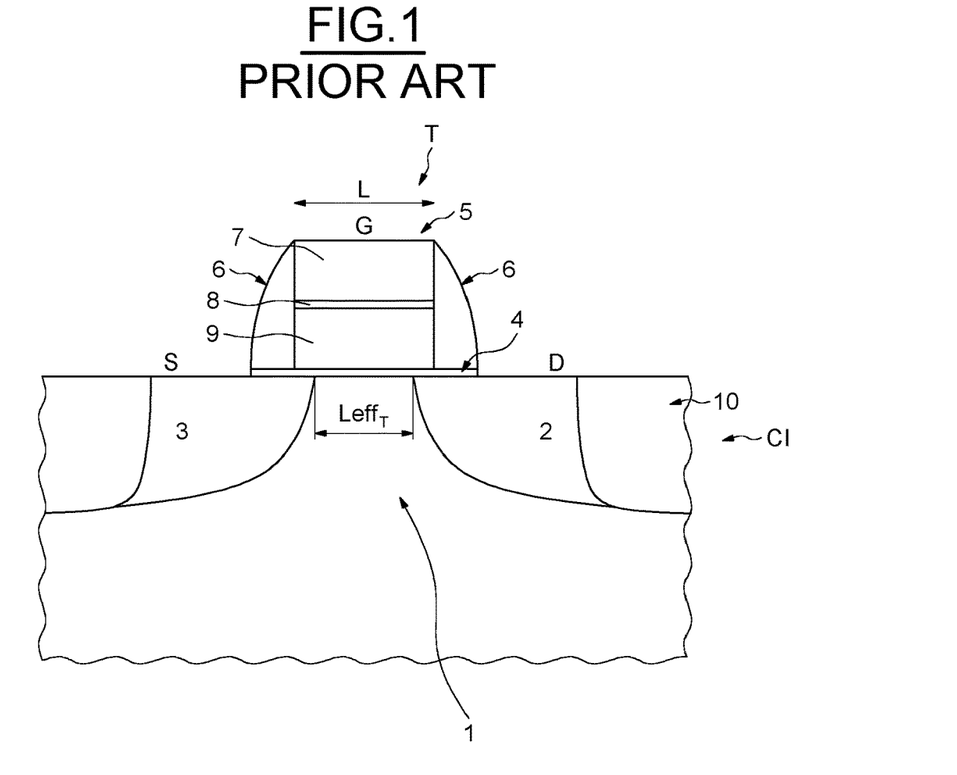
FIGS. 1-2 illustrate a double-gate MOS transistor according to the prior art.

FIG. 1 schematically illustrates an integrated circuit CI comprising a double-gate MOS transistor T.

The transistor T is produced in and on an active zone 1 of a semiconductor substrate, said active zone being bounded by an isolating region 10, for example of shallow trench isolation (STI) type.

The active zone 1 comprises two separate doped regions 2, 3, the region 2 forming the drain D of the transistor and the region 3 forming the source S of the transistor. The active zone 1 is partially covered with a layer 4 of silicon oxide (gate oxide). A region 5 comprising polysilicon or a metal forms the double gate G of the transistor and surmounts the layer of gate oxide. The double gate G includes, as is conventional, on its flanks, lateral insulating regions or "spacers" 6.

The double gate G has a length L, which is measured in the source-drain direction.

The double gate G comprises a first polysilicon region 9 and a second polysilicon region 7, the latter being located above the first region.

The two regions 7 and 9 are separated by a layer 8, for example a layer of silicon oxide or an oxide-nitride-oxide layer, known by the acronym ONO layer in the art.

A channel length $Leff_T$ separates the drain region 2 and the source region 3.

Figure 2:
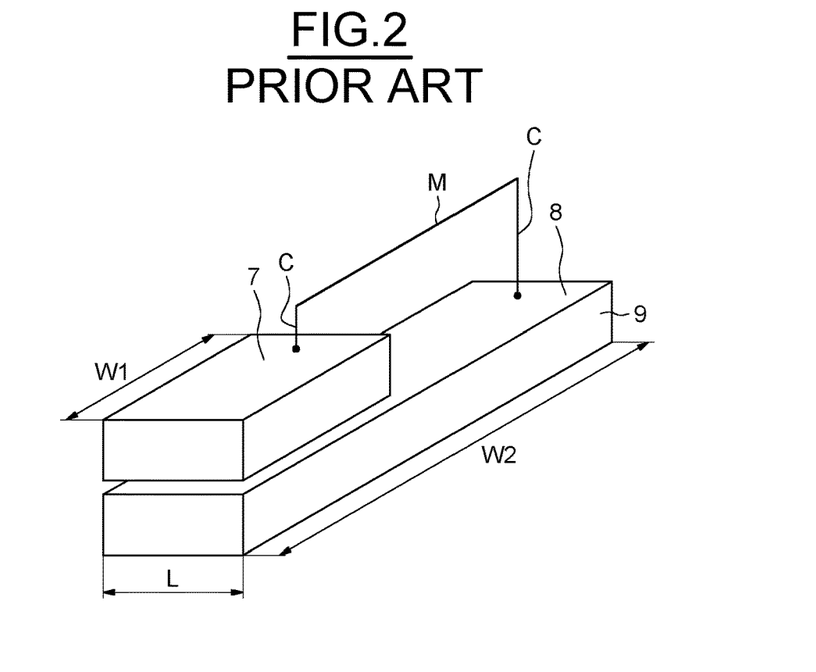

FIG. 2 shows a double gate G with the two polysilicon regions 7 and 9 connected together.

The second polysilicon region 7 has a width W1, measured transversely to the source-drain direction, larger than or equal to the width of the active zone and smaller than the width W2 of the first region 9.

In theory, only the first region 9 needs to be biased. This being so, in practice, in order to avoid leaving one region floating, it is preferable for the two regions 7 and 9 to be connected together by an electrical connection for example containing contacts C and a metallization M that is located in the first metal level of the interconnection portion (i.e., the portion known to those skilled in the art as the back end of line or "BEOL" portion) of the integrated circuit.

The selection transistor is subjected, in particular on its drain, to high voltages, for example voltages of about 13 V. It must therefore have a breakdown voltage higher than these voltage levels. Breakdown voltage is known by the acronym "BV" in the art.

However, following technological evolutions, modifications of the geometry of the active zone of this type of transistor have led to a decrease in its breakdown voltage BV and to an increase in its leakage current $I_{OFF}$, thereby making these electrical parameters incompatible with certain envisaged applications.

The intrinsic electrical characteristics of a transistor, in particular its breakdown voltage BV, may be modified, for example by modifying the dopant implant schemes of the drain and source regions.

However, modifying doping in this way, in particular when it is a question of the doping of the drain and source regions, is complex to do and economically very costly.

There is a need to improve the electrical characteristics of double-gate transistors, in particular the breakdown voltage and leakage current of these transistors, without modifying the conventionally used implant scheme.

SUMMARY

According to embodiments and implementations, it is advantageously proposed to modify the structure of the double gate so as to make provision to cause the lower region, or gate, of the double gate to protrude on at least one side, preferably on the drain side, past the upper region of the double gate, and thus to modify certain electrical characteristics of the transistor, and in particular to increase the value of the breakdown voltage and decrease the value of the current $I_{OFF}$.

According to one aspect, an integrated circuit is provided including at least one MOS transistor located in and on a semiconductor substrate and having a drain region, a source region and a gate region. The gate region includes a first region that is insulated from and located above the substrate and a second region that is insulated from and located above the first region. The first region has a first length measured in the drain-source direction and the second region has a second length measured in the drain-source direction. The first length is larger than the second length, the first region protruding longitudinally in the drain-source direction at least on one side of the second region over at least one of the source and drain regions.

The first region preferably has a uniform height, this in particular facilitating the fabricating process.

This being so, it is possible for the height of the first region not to be uniform and, for example, for the first region to possess a central zone having the second length and at least one stair jutting from the central zone, the sum of the length of the central zone and of the length of the stair being equal to the first length.

This being so, it makes it possible to control the amount of doping passing through the at least one stair.

Advantageously, a gradual junction between substrate and drain region or substrate and source region can be made.

If a protrusion on a single side is envisaged, it is preferable for the first region to protrude on the side of the drain region.

For example, in the case of a transistor used as an inverter, the source of the transistor is connected to ground. The drain region will be subjected to the largest voltage increase, for example 13 V in the case of a selection transistor. In other words, the drain region must withstand high voltages well. This is the reason why it is preferable for the first region to protrude on the side of the drain region.

This being so, in particular in order to simplify the fabricating process, it is advantageous for the first region to protrude on the side of the source region and on the side of the drain region.

The protruding portions of the first region are preferably dimensionally identical, but could be dimensionally different.

The gate region includes on its flanks insulating lateral regions covering the first region and the second region.

According to one embodiment, the first region protrudes at least on one side by a protrusion length, and the distance between the end of the doping profile of the source region or drain region which is located under the first region and the end of the protruding portion of the first region is larger than said protrusion length.

In other words, the effective channel length is decreased with respect to that of a conventional double-gate transistor having two gate regions of same length.

The two regions are advantageously electrically connected together, so as not to leave the second region floating.

The transistor defined above may advantageously be a selection transistor of a non-volatile memory cell, for example an EEPROM cell.

Thus, according to one embodiment, the integrated circuit may furthermore comprise at least one memory, comprising at least one memory cell including a state transistor having a floating gate and a control gate, a bit-line selection transistor that is connected to the state transistor and configured to be coupled to a bit line and a control-gate selection transistor that is connected to the control gate and configured to be coupled to a gate-control line. The at least one of the selection transistors is advantageously said MOS transistor having said first region protruding from said second region.

According to another aspect, a process is proposed for producing a MOS transistor, in and on a semiconductor substrate, comprising: forming above the substrate an insulated gate region including a first insulated region and a second insulated region that is located above the first region, the first region protruding at least on one side from the second region, and carrying out a tilted implantation of dopants in the substrate through the gate region so as to form the source region and drain region of the transistor.

According to one implementation, the formation of the gate region includes: forming on the substrate a first dielectric layer, forming on the first dielectric layer a first layer of gate material, at least partially etching the first layer of gate material so as to form the first region, forming a second dielectric layer on the structure obtained in the preceding step, forming on the structure obtained in the preceding step a second layer of gate material, and etching the second layer of gate material so as to form the second region.

BRIEF DESCRIPTION OF THE DRAWINGS

Other advantages and features of the invention will become apparent on examining the detailed description of completely non-limiting embodiments, and the appended drawings, in which.

DETAILED DESCRIPTION

Figure 3:
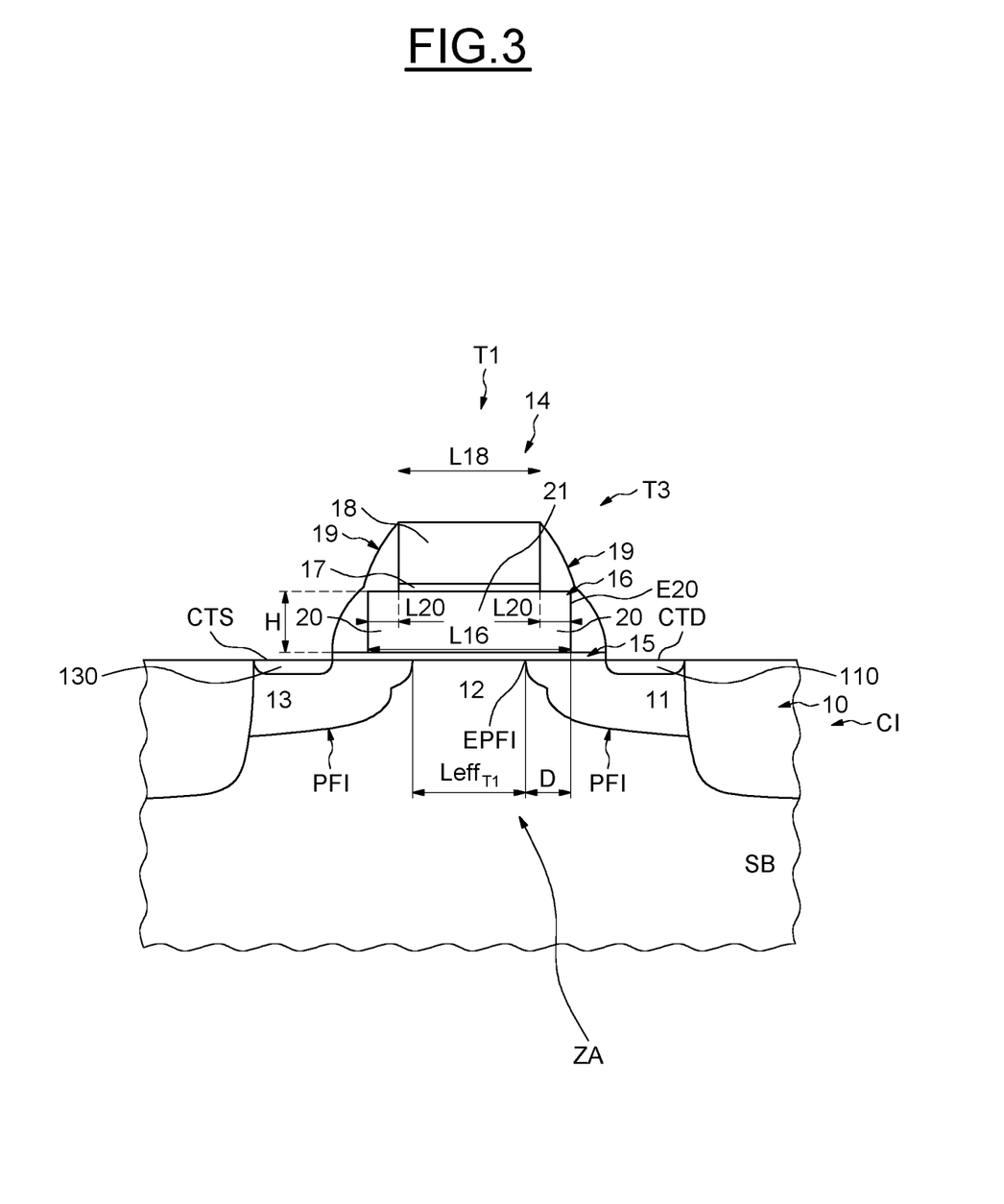
FIGS. 3-5 schematically show an example embodiment of an integrated circuit comprising an example double-gate MOS transistor.
Figure 4:
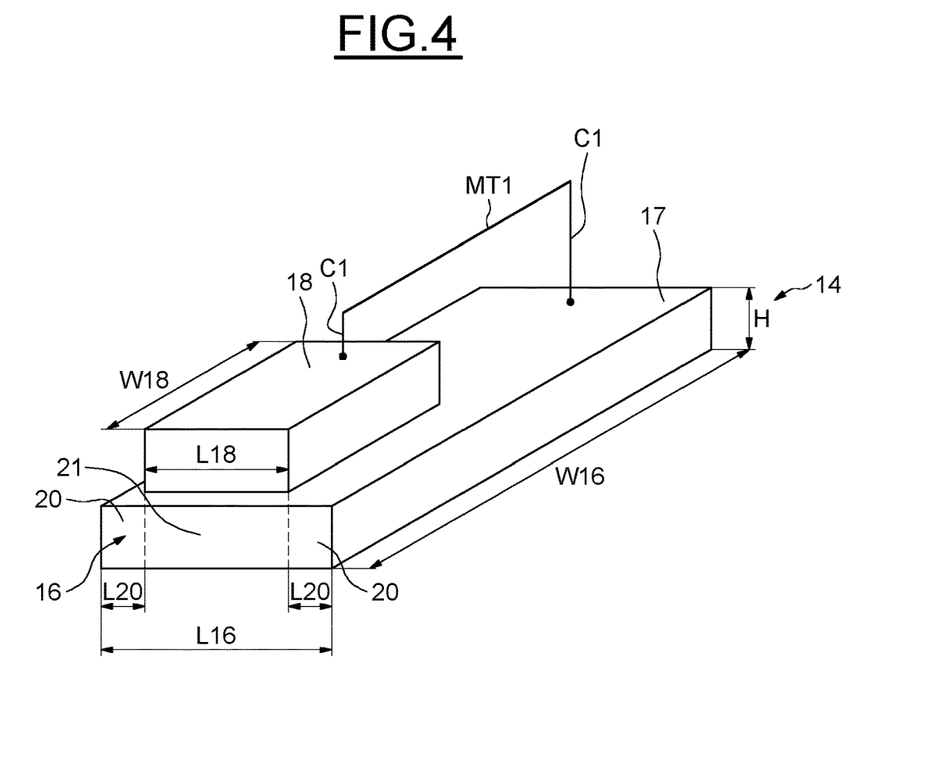

Reference is now made to FIGS. 3 and 4 which schematically show an example embodiment of an integrated circuit CI 1 comprising an example double-gate MOS transistor T1.

The MOS transistor T1 is located in and on an active zone ZA of a semiconductor substrate SB.

The active zone ZA is surrounded by an isolating region 10, for example of the shallow trench isolation (STI) type.

The active zone ZA includes a doped drain region 11 and a doped source region 13, which regions are separated by a channel region 12 of length $Leff_{T1}$, all thereof being produced in the semiconductor substrate SB.

The substrate SB may be a bulk substrate or indeed a semiconductor well, or even a semiconductor film of a silicon-on-insulator (SOI) substrate.

In the case of an nMOS transistor, the source and drain regions are n-doped. The source and drain regions are instead p-doped for a pMOS transistor.

Conventionally, the source and drain regions are silicided in order to allow contacts, CTS one the source-region side and CTD on the drain-region side, to be formed.

The references 110 and 130 designate the silicided portions of the drain and source regions 11, 13.

The transistor T1 also includes a gate region 14 that is insulated from the active zone by a layer 15 of gate oxide.

The gate region 14 includes a first region 16 that is located above the substrate SB, of length L16 measured in the drain-source direction, and of width W16 measured transversely to the length L16. The gate region 14 also includes a second region 18 of length L18 measured in the drain-source direction and of width W18 measured transversely to the length L18, which is located above the first region 16 and insulated therefrom by another layer 17 of gate oxide.

The first length L16 is larger than the second length L18.

The first width W16 is generally larger than the width of the active zone and advantageously larger than the second width W18, so as to allow, as will be seen in more detail below, the two regions 16 and 18 to be electrically connected.

The first region 16 possesses a central zone 21 having the second length L18 and two portions 20 protruding from the central zone 21. The sum of the length L18 of the central zone and of two times the length L20 of the protruding portions 20 is equal to the first length L16.

The protruding portions 20 are here of identical dimensions.

In this example, the first region 16 protrudes longitudinally on both sides of the second region 18, over the source and drain regions 13, 11, by the protrusion length L20. This being so, it is possible, as indicated below, for the first region 16 to protrude only on a single side.

According to one non-limiting example, L16 is equal to 800 nm, L18 is equal to 600 nm, and L20 is equal to 100 nm.

The upper portion of the region 18 is silicided (this silicided portion not being shown in the figures).

The regions 16 and 20 are here of identical material and are, for example, made of polysilicon.

The first region 16 here has a uniform height H, for example 100 nm.

As will be seen in detail below, these protruding portions 20 will allow, during the doping of the drain and source regions, the doping profile of these regions to be modified and thus the electrical characteristics of the transistor T1, and in particular its breakdown voltage, to be modified because the protruding portion 20 forms an additional thickness for the dopants to pass through.

The doping profile PFI of the source region 13 or drain region 11 is partially located under the protruding portion 20 and protrudes on both sides of this protruding portion. The distance D between that end EPFI of the doping profile PFI which is located under the central zone 21 of the first gate region 16, and the end E20 of the protruding portion 20, is larger than the protrusion length L20 of the protruding portion 20. D is, for example, equal to 200 nm.

The channel length $Leff_{T1}$ of the MOS transistor T1 is thus smaller than the channel length $Leff_T$ of a conventional transistor, such as that illustrated in FIGS. 1 and 2, the two gate regions of which are of the same length.

The gate region 14 includes, on its flanks, insulating lateral regions or spacers 19 covering the first region 16 and the second region 18.

The two regions 16 and 18 are preferably electrically connected together by contacts C1 and a metallization MT1 located in the first metal level of the interconnection (BEOL: back end of line) portion of the integrated circuit CI1.

It is within the ability of a person skilled in the art to adjust the dimensions of the protruding portions 20 depending on the desired improvements, in particular in terms of breakdown voltage.

By way of example, for L18 equal to 730 nm and a length L20 of the protruding portions equal to 100 nm and a distance D of 200 nm and a height H equal to 100 nm, the breakdown voltage BV of the transistor is increased by 1 V, and the leakage current Ioff is divided by 3.

Figure 5:
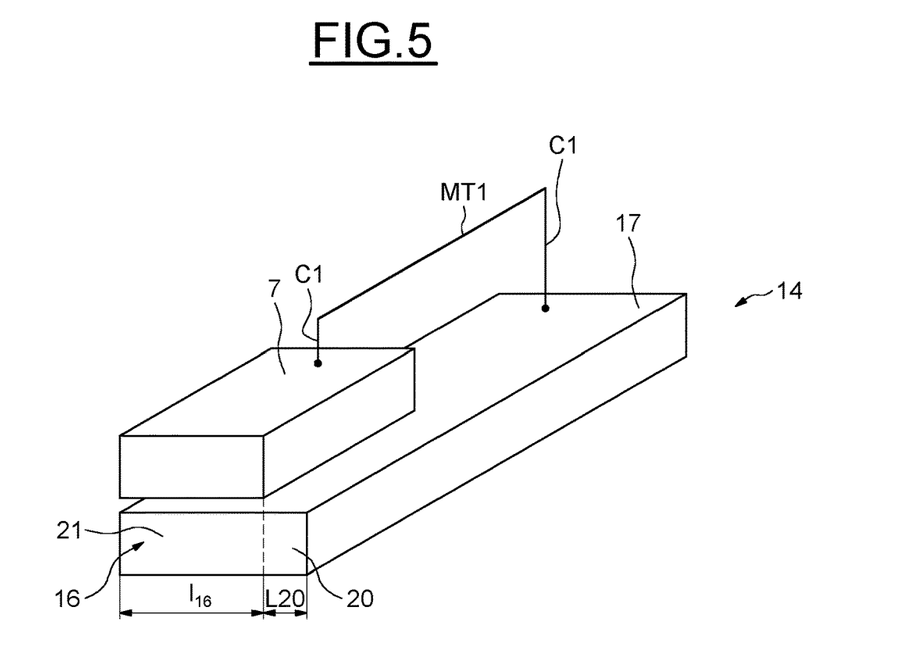

Although in the embodiment illustrated in FIGS. 3 and 4 the protruding portions 20 shown lie on both sides of the gate region 14, it is possible, as illustrated in FIG. 5, to make provision to produce only a single protruding portion 20.

This single protruding portion 20 then preferably lies on the side of the region of the drain 11. Specifically, the drain region 11 is biased differently from the substrate SB and is intended to receive the high voltage. Furthermore, it is the p-n junction drain side that will have the most impact on breakdown voltage.

An example of a process for fabricating a MOS transistor is now described with reference more particularly to FIGS. 6 to 11. In this example, the first region of the gate region of the MOS transistor has a length L16 of 800 nm and the second region of the double gate of the MOS transistor has a length L18 of 600 nm. Therefore, each protruding portion has a protrusion length L20 of 100 nm. The first and second gate regions are here made of polysilicon.

Elements that are identical to those described above with reference to FIGS. 3 to 5 have been referenced by the same reference numbers.

Figure 6:
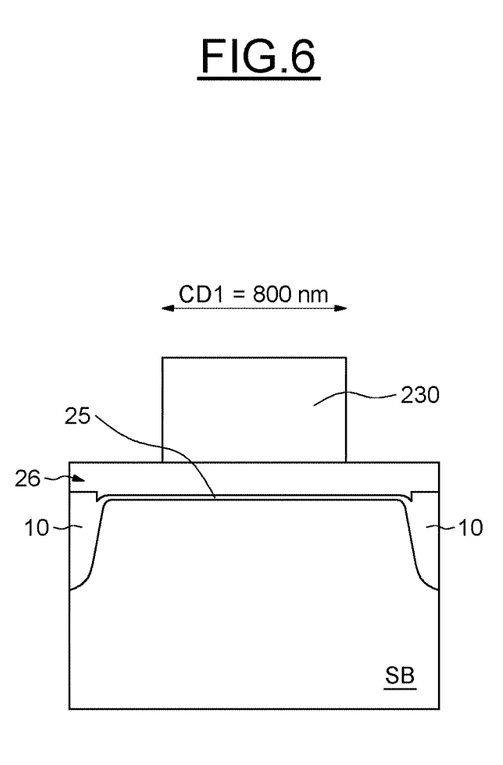
FIGS. 6-11 show a process for fabricating the double-gate MOS transistor.

As illustrated in FIG. 6, on a substrate SB that is surmounted with a first dielectric layer, for example of silicon dioxide 25, a polysilicon layer 26 that is generally surmounted with a hard-masking layer (not shown here for the sake of simplicity) is formed in a conventional and known way. Above the layer 26, a resist block 230 is formed, said resist block being obtained in a conventional and known way by photolithography, exposure and development of a resist layer. The resist block 230 has a dimension CD1 equal to 800 nm.

Figure 7:
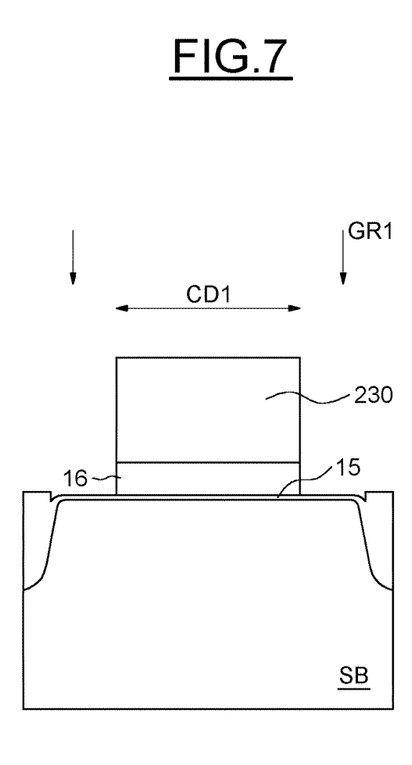

In another step illustrated in FIG. 7, a first conventional etch GR1 is carried out using the resist block 230 then the corresponding remaining hard mask as an etch mask. The first polysilicon layer 26 is etched in the plasma in such a way that the polysilicon region obtained extends over the width W16 (measured transversely to the length L16 equal to CD1). The first polysilicon region 16 of the gate region 14 is obtained.

Figure 8:
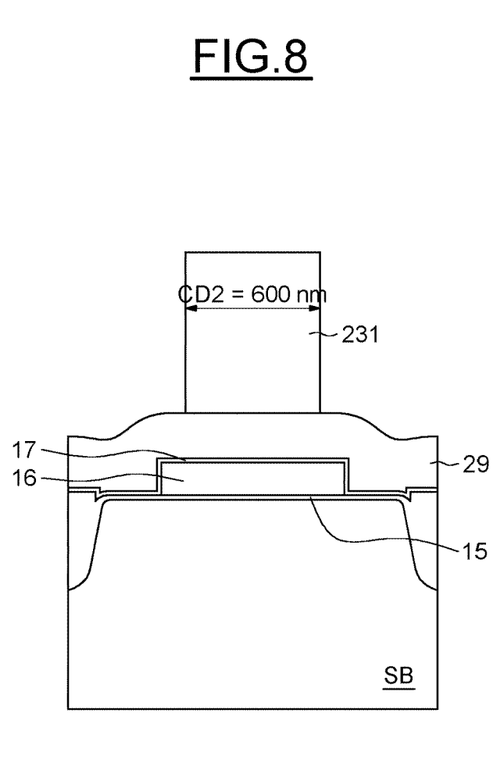

Next, as illustrated in FIG. 8, the surface of the obtained assembly is covered with a second dielectric layer 17, for example of silicon dioxide, itself covered with a second polysilicon layer 29.

Next, a second resist block 231 having a dimension CD2 of 600 nm, which will become the length of the second region of the double gate, is produced in a conventional way that is analogous to that described with reference to FIG. 6.

Figure 9:
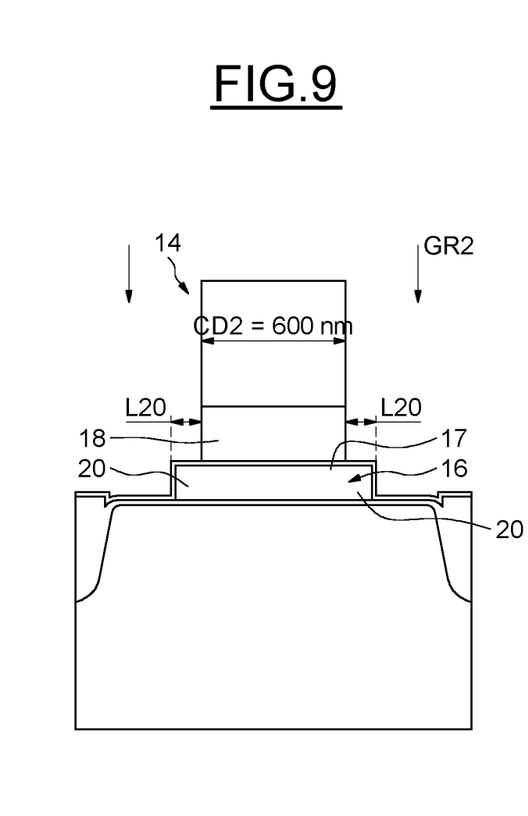

Next, as illustrated in FIG. 9, the second polysilicon layer is etched in a plasma etch GR2 in such a way that the obtained region 18 extends over the width W18 (measured transversely to the length L18 equal to CD2). The result is a gate 14 comprising the first polysilicon region 16 comprising the protruding portions 20 of length L20 equal to 100 nm, surmounted with the silicon-oxide layer 17 surmounted with the second region 18.

Figure 10:
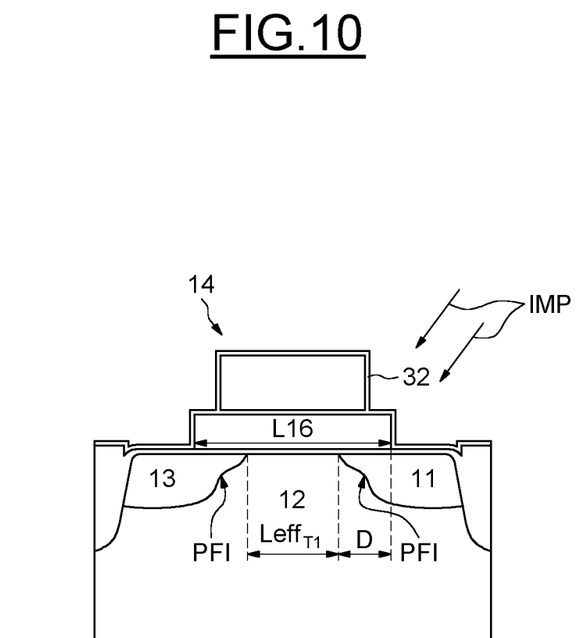

As illustrated in FIG. 10, a tilted implantation IMP of dopants, for example at an angle of 20° and an energy of 90 keV, is carried out so as to obtain source and drain regions 13, 11 having the doping profile PFI. The distance D and the channel length $Leff_{T1}$ are achieved.

Next, the spacers 19 and the silicided drain and source zones 110 and 130 and the silicided gate zone are formed in a conventional way so as to obtain the transistor T1 of FIG. 3.

Advantageously, the portion(s) protruding from one or both sides of the foot of the double gate modify the distribution of the dopants implanted in the drain and source regions in the doping step of the fabricating process of the transistors. This allows for adjusting the amount of doping that passes through the step and provides a means by which gradual junctions can be formed. It further permits exercise of control over only the source/drain implant, instead of having the implant affect both the lightly doped drain region and the source/drain region.

This modification of the doping profile leads to a modification of the electrical properties of the transistor T1, in particular its breakdown threshold voltage BV and the leakage current Ioff.

Figure 11:
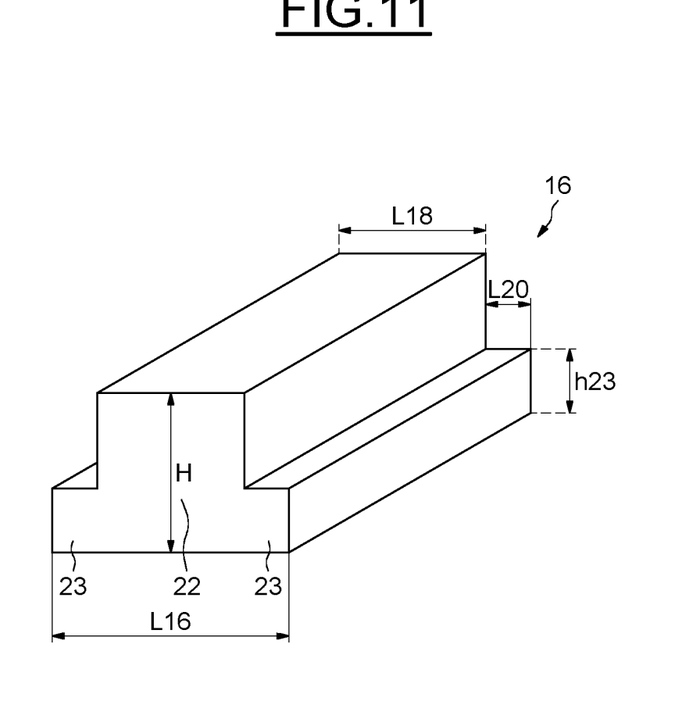

Although in the above embodiments a first region 16 of uniform height H of the gate region 14 was described, it is also possible, as illustrated in FIG. 11, to provide a first region 16 of variable height H. FIG. 11 shows the region 16 comprising a central zone 22, of length equal to the length L18, of the second region 18 and at least one stair 23, of height h23 different from H, jutting from the central zone 22.

The sum of the length L18 and of two times the protrusion length L20 is equal to the length L16.

Figure 12:
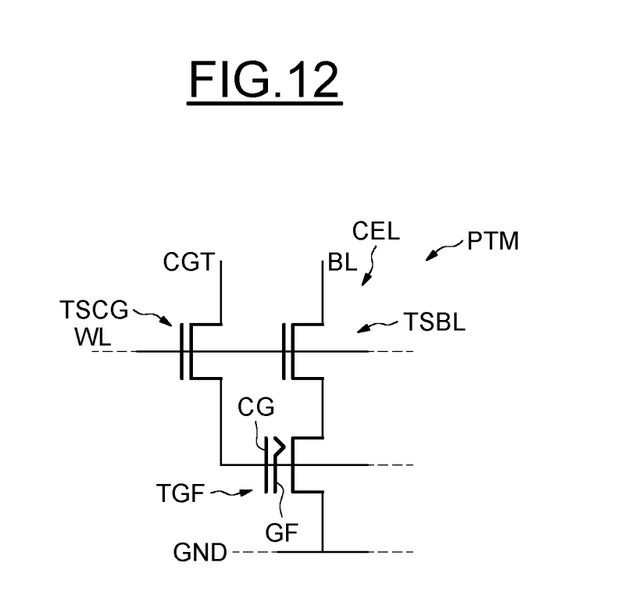
FIG. 12 illustrates use of the transistor as a selection transistor of a non-volatile memory cell.

As illustrated in FIG. 12, the transistor T1 described above may advantageously be a selection transistor of a non-volatile memory cell, for example an EEPROM cell.

More precisely, in the illustrated example, the memory PTM here includes a memory cell CEL including a state transistor TGF having a control gate CG and a floating gate GF. The cell CEL is connected to ground GND and to a bit line BL by way of a bit-line selection transistor TSBL.

The cell CEL moreover includes a control-gate selection transistor TSCG that is connected between a control-gate line CGT and the control gate CG of the floating-gate transistor TGF.

The gates of the transistors TSCG and TSBL are connected to a word line WL that conventionally extends perpendicularly to the bit line BL.

It should be noted that in certain cases the memory may include two memory cells per logic bit, said cells being respectively connected to two bit lines by way of two bit-line selection transistors.

The control-gate selection transistor TSCG and/or the bit-line selection transistor TSBL may be a transistor(s) T1 such as described above.

Of course, it will be possible to use the transistor T1 in another high-voltage application.

The invention claimed is:

1. An integrated circuit, comprising:
    at least one MOS transistor located in and on a semiconductor substrate and having a drain region, a source region and a conductive gate;
    wherein the conductive gate includes:
        a first conductive gate region that is insulated from and located above the semiconductor substrate; and
        a second conductive gate region that is insulated from and located above the first conductive gate region;
        wherein the first conductive gate region has a first length measured in a drain-source direction and the second conductive gate region has a second length measured in the drain-source direction, the first length being larger than the second length, and the first conductive gate region protruding longitudinally in the drain-source direction at least on one side of the second conductive gate region so as to extend over at least one of the source and drain regions; and
        wherein the first conductive gate region has a non-uniform height along said first length and includes a central zone having the second length with a first height and at least one stair zone extending from the central zone with a second height less than the first height, wherein a sum of a length of the central zone and a length of each included stair zone is equal to the first length.

2. The integrated circuit according to claim 1, wherein the first conductive gate region protrudes to extend over the drain region.

3. The integrated circuit according to claim 1, wherein the first conductive gate region protrudes to extend over both the source region and the drain region.

4. The integrated circuit according to claim 3, wherein the protruding portions of the first conductive gate region over the source and drain regions are dimensionally identical.

5. The integrated circuit according to claim 1, wherein the conductive gate region includes insulating lateral regions covering sides of the first conductive gate region and the second conductive gate region.

6. The integrated circuit according to claim 1, wherein the first conductive gate region protrudes at least on one side by a protrusion length, and wherein a distance between an end of a doping profile of the source region or drain region which is located under the first conductive gate region and the end of the protruding portion of the first conductive gate region is larger than said protrusion length.

7. The integrated circuit according to claim 1, wherein the first and second conductive gate regions are electrically connected together.

8. An integrated circuit, comprising:
    at least one memory cell including:
        a state transistor having a floating conductive gate and a control conductive gate;
        a bit-line selection transistor that is connected to the state transistor and configured to be coupled to a bit line; and
        a control-gate selection transistor that is connected to the control conductive gate and configured to be coupled to a gate-control line;
    wherein at least one of the bit-line selection transistor and the control-gate selection transistor comprises a MOS transistor located in and on a semiconductor substrate and having a drain region, a source region and a conductive gate;
    wherein the conductive gate includes:
        a first conductive gate region that is insulated from and located above the semiconductor substrate; and
        a second conductive gate region that is insulated from and located above the first conductive gate region;
        wherein the first conductive gate region has a first length measured in a drain-source direction and the second conductive gate region has a second length measured in the drain-source direction, the first length being larger than the second length, and the first conductive gate region protruding longitudinally in the drain-source direction at least on one side of the second conductive gate region so as to extend over at least one of the source and drain regions.

9. The integrated circuit according to claim 8, wherein the first conductive gate region has a uniform height.

10. The integrated circuit according to claim 8, wherein the first conductive gate region has a non-uniform height along said first length and includes a central zone having the second length with a first height and at least one stair zone extending from the central zone with a second height less than the first height, wherein a sum of a length of the central zone and a length of each included stair zone is equal to the first length.

11. The integrated circuit according to claim 8, wherein the first conductive gate region protrudes to extend over the drain region.

12. The integrated circuit according to claim 8, wherein the first conductive gate region protrudes to extend over both the source region and the drain region.

13. The integrated circuit according to claim 12, wherein the protruding portions of the first conductive gate region over the source and drain regions are dimensionally identical.

14. The integrated circuit according to claim 8, wherein the conductive gate region includes insulating lateral regions covering sides of the first conductive gate region and the second conductive gate region.

15. The integrated circuit according to claim 8, wherein the first conductive gate region protrudes at least on one side by a protrusion length, and wherein a distance between an end of a doping profile of the source region or drain region which is located under the first conductive gate region and the end of the protruding portion of the first conductive gate region is larger than said protrusion length.

16. The integrated circuit according to claim 8, wherein the first and second conductive gate regions are electrically connected together.

17. An integrated circuit, comprising:
    at least one MOS transistor located in and on a semiconductor substrate and having a drain region, a source region and a conductive gate;

wherein the conductive gate includes:
- a first conductive gate region that is insulated from and located above the semiconductor substrate; and
- a second conductive gate region that is insulated from and located above the first conductive gate region;
- wherein the first conductive gate region has a first length measured in a drain-source direction and the second conductive gate region has a second length measured in the drain-source direction, the first length being larger than the second length, and the first conductive gate region protruding longitudinally in the drain-source direction at least on one side of the second conductive gate region so as to extend over at least one of the source and drain regions; and
- wherein the first and second conductive gate regions are electrically connected together.

18. The integrated circuit according to claim 17, wherein the first conductive gate region has a uniform height along said first length.

19. The integrated circuit according to claim 17, wherein the first conductive gate region has a non-uniform height along said first length.

20. The integrated circuit according to claim 17, wherein the first conductive gate region protrudes to extend over the drain region.

21. The integrated circuit according to claim 17, wherein the first conductive gate region protrudes to extend over both the source region and the drain region.

22. The integrated circuit according to claim 21, wherein the protruding portions of the first conductive gate region over the source and drain regions are dimensionally identical.

23. The integrated circuit according to claim 17, wherein the conductive gate region includes insulating lateral regions covering sides of the first conductive gate region and the second conductive gate region.

24. The integrated circuit according to claim 17, wherein the first conductive gate region protrudes at least on one side by a protrusion length, and wherein a distance between an end of a doping profile of the source region or drain region which is located under the first conductive gate region and the end of the protruding portion of the first conductive gate region is larger than said protrusion length.

* * * * *